United States Patent
Babikian et al.

(10) Patent No.: US 6,865,437 B1
(45) Date of Patent: Mar. 8, 2005

(54) ROBOT PRE-POSITIONING IN A WAFER PROCESSING SYSTEM

(75) Inventors: Dikran Babikian, Millbrae, CA (US); Hilario Oh, Rochester Hills, MI (US)

(73) Assignee: ASML Holdings N.V., Veldhoven (NL)

( * ) Notice: Subject to any disclaimer, the term of this patent is extended or adjusted under 35 U.S.C. 154(b) by 502 days.

(21) Appl. No.: 09/602,527

(22) Filed: Jun. 23, 2000

Related U.S. Application Data

(63) Continuation-in-part of application No. 09/336,275, filed on Jun. 18, 1999.
(60) Provisional application No. 60/140,661, filed on Jun. 23, 1999, and provisional application No. 60/114,422, filed on Dec. 31, 1998.

(51) Int. Cl.[7] .......................... G06F 19/00; H01H 43/00
(52) U.S. Cl. ...................... 700/121; 700/100; 700/306; 438/908
(58) Field of Search ............................... 700/3, 14, 71, 700/99, 100, 112, 121, 306; 438/907, 908

(56) References Cited

U.S. PATENT DOCUMENTS

| | | | |
|---|---|---|---|
| 5,136,222 A | | 8/1992 | Yamamoto et al. ...... 318/568.2 |
| 5,226,118 A | * | 7/1993 | Baker et al. ................ 345/440 |
| 5,428,555 A | | 6/1995 | Starkey et al. ......... 364/551.01 |
| 5,591,299 A | | 1/1997 | Seaton et al. ............. 156/626.1 |
| 5,754,780 A | | 5/1998 | Asakawa et al. ...... 395/200.38 |
| 5,801,945 A | | 9/1998 | Comer .................. 364/468.06 |
| 5,858,863 A | * | 1/1999 | Yokoyama et al. ......... 438/514 |
| 5,928,389 A | * | 7/1999 | Jevtic ........................ 29/25.01 |
| 5,943,230 A | * | 8/1999 | Rinnen et al. ........... 427/255.5 |
| 5,980,591 A | * | 11/1999 | Akimoto et al. ........... 29/25.01 |
| 6,122,566 A | * | 9/2000 | Nguyen et al. ............. 438/908 |
| 6,201,999 B1 | * | 3/2001 | Jevtic ......................... 118/719 |
| 6,298,274 B1 | * | 10/2001 | Inoue ......................... 700/112 |
| 6,336,204 B1 | * | 1/2002 | Jevtic ......................... 414/936 |
| 6,360,132 B2 | * | 3/2002 | Lin et al. ............... 204/298.25 |
| 6,408,220 B1 | * | 6/2002 | Nulman ..................... 438/450 |

FOREIGN PATENT DOCUMENTS

| | | | | |
|---|---|---|---|---|
| EP | 0 800 203 | | 10/1997 | ........... H01L/21/00 |
| WO | 98 57358 | | 12/1998 | ........... H01L/21/00 |
| WO | WO 99/64940 | | 12/1999 | ......... G05B/19/414 |
| WO | 00 41048 | | 7/2000 | ........... H01L/21/00 |

\* cited by examiner

Primary Examiner—Leo Picard
Assistant Examiner—Elliot L Frank
(74) Attorney, Agent, or Firm—Blakely, Sokoloff, Taylor & Zafman LLP

(57) ABSTRACT

A wafer cluster tool is described which operates in a regular, periodic fashion. Embodiments of the invention have a periodicity of one sending period. The invention enables the determination of pick-up times for process chambers in the cluster tool, and embodiments of the invention allow the creation and maintenance of an updated timetable. The timetable indicates times when each of the process chambers is to be serviced. These values are updated as the process chambers receive new wafers. Robots in the cluster tool may pre-position themselves in front of modules, or process chambers, to be served. Robot pre-positioning eliminates the wait time of individual modules beyond queue times which have been pre-determined for the modules. This renders the path of the individual robots pre-deterministic, and enables the cluster tool to utilize single gripper robots.

7 Claims, 14 Drawing Sheets

Fig. 6

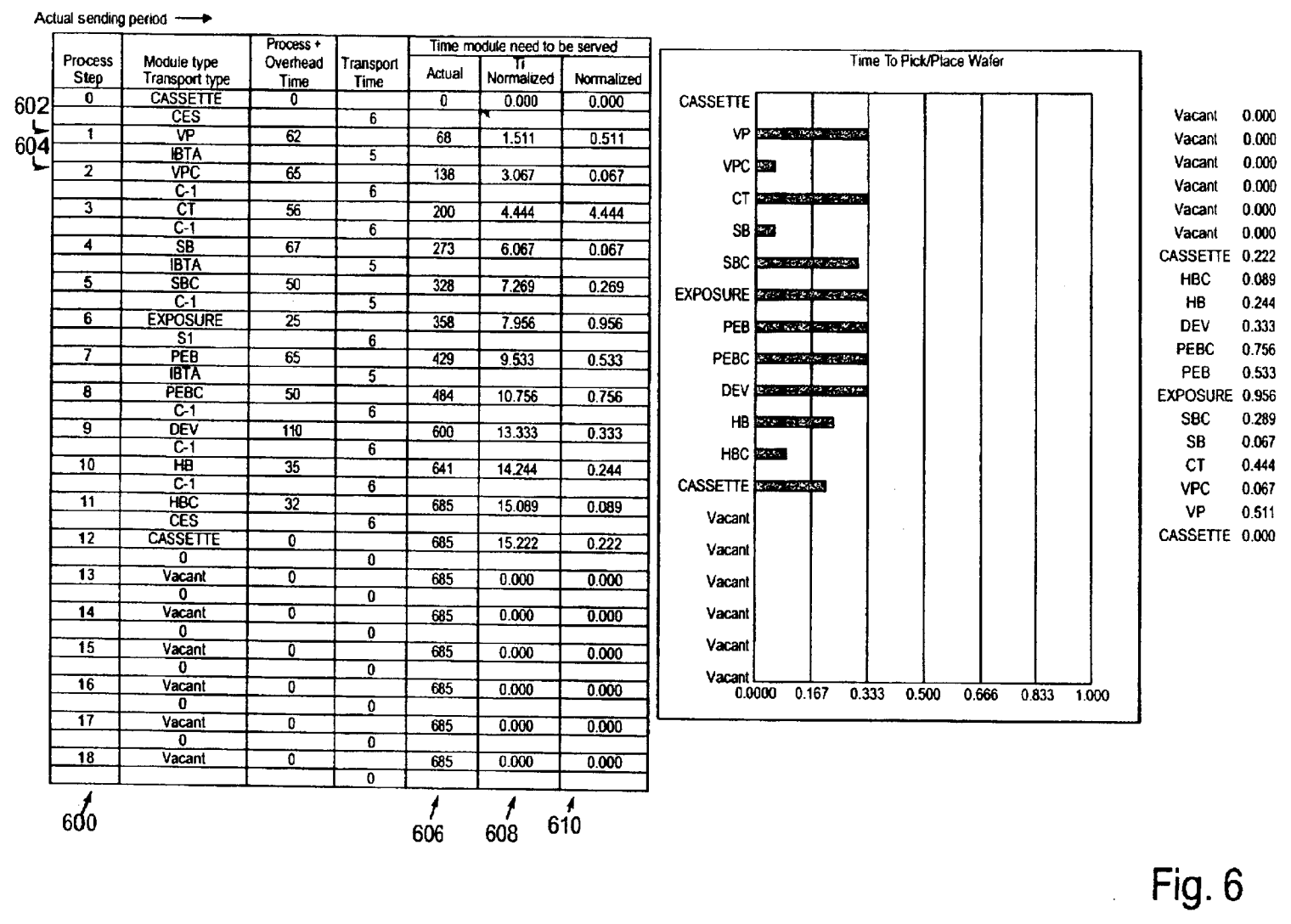

| Process Step | Module type Transport type | Process + Overhead Time | Transport Time | Time module need to be served | | |
|---|---|---|---|---|---|---|
| | | | | Actual | Tf Normalized | Normalized |
| 0 | CASSETTE / CES | 0 | 6 | 0 | 0.000 | 0.000 |
| 1 | VP / C-1 | 62 | 5 | 68 | 1.511 | 0.511 |
| 2 | VPC / C-1 | 65 | 6 | 138 | 3.067 | 0.067 |
| 3 | CT / C-1 | 56 | 6 | 200 | 4.444 | 4.444 |
| 4 | SB / IBTA | 67 | 5 | 273 | 6.067 | 0.067 |
| 5 | SBC / C-1 | 50 | 5 | 328 | 7.269 | 0.269 |
| 6 | EXPOSURE / S1 | 25 | 6 | 358 | 7.956 | 0.956 |
| 7 | PEB / IBTA | 65 | 5 | 429 | 9.533 | 0.533 |
| 8 | PEBC / C-1 | 50 | 6 | 484 | 10.756 | 0.756 |
| 9 | DEV / C-1 | 110 | 6 | 600 | 13.333 | 0.333 |
| 10 | HB / C-1 | 35 | 6 | 641 | 14.244 | 0.244 |
| 11 | HBC / CES | 32 | 6 | 685 | 15.089 | 0.089 |
| 12 | CASSETTE | 0 | 0 | 685 | 15.222 | 0.222 |
| 13 | Vacant / 0 | 0 | 0 | 685 | 0.000 | 0.000 |
| 14 | Vacant / 0 | 0 | 0 | 685 | 0.000 | 0.000 |
| 15 | Vacant / 0 | 0 | 0 | 685 | 0.000 | 0.000 |
| 16 | Vacant / 0 | 0 | 0 | 685 | 0.000 | 0.000 |
| 17 | Vacant / 0 | 0 | 0 | 685 | 0.000 | 0.000 |
| 18 | Vacant / 0 | 0 | 0 | 685 | 0.000 | 0.000 |

Time To Pick/Place Wafer

| Module | Value |
|---|---|
| CASSETTE | 0.000 |
| VP | 0.000 |
| VPC | 0.000 |
| CT | 0.000 |
| SB | 0.000 |
| SBC | 0.000 |
| EXPOSURE | 0.222 |
| PEB | 0.089 |
| PEBC | 0.244 |
| DEV | 0.333 |
| HB | 0.756 |
| HBC | 0.533 |
| CASSETTE | 0.956 |
| Vacant | 0.289 |
| Vacant | 0.067 |
| Vacant | 0.444 |
| Vacant | 0.067 |
| Vacant | 0.511 |
| Vacant | 0.000 |

Fig. 8

ROBOT PRE-POSITIONING IN A WAFER PROCESSING SYSTEM

This application claims the benefit of priority of provisional application No. 60/140,661, filed Jun. 23, 1999 and is a CIP of U.S. patent application Ser. No. 09/336,275, filed Jun. 18, 1999, which is a continuation-in-part of U.S. patent application Ser. No. 60/114,422, filed Dec. 31, 1998, all of which are herein incorporated by reference in their entirety. This application is also related to U.S. patent application Ser. No. 09/521,026, filed Mar. 7, 2000 which is herein incorporated by reference in its entirety.

BACKGROUND OF THE INVENTION

1. Field of the Invention

This invention relates to the field of wafer processing. In particular, the invention relates to scheduling techniques for wafer cluster tools.

2. Description of the Related Art

In the process of manufacturing a semiconductor device such as an integrated circuit, numerous steps of microfabrication are performed to form a device. These steps are performed serially on the individual items of manufacture in individual modules; the items of manufacture are transferred between modules by transport mechanisms such as robots. In order to achieve desirable throughput, reliability, and fabrication quality, several conditions must be met:

1) The delivery and removal of the substrate to and from the process modules, as well as the transportation of the wafer between modules, must be accomplished in a timely manner. This timely delivery and removal of substrate is achieved when the flow of substrate is maintained in a periodic and synchronized manner. If periodicity and synchronization are not maintained, the process results will be inconsistent from substrate to substrate, and the expected throughput may be reduced.

2) It is desirable to transport the substrate in similar process flow paths to avoid inconsistency in process results due to variations in the process history of the substrates.

3) It is imperative to ensure that the articles of manufacture do not spend any pre-process or post-process time idling in modules where critical processes are performed. The addition of pre-process or post-process time in these modules degrades not only the throughput but also the process results. For example, in an IC fabrication system, if a substrate is not immediately transferred from the spin coat module to a bake module to thermally cure a photo-resist film layer, the resulting film thickness will be unpredictable. If it is impossible to totally eliminate pre-process and/or post-process times, they should be rendered as brief as possible, and any variations in these times cannot be allowed.

The inability to meet any or all of the above conditions come from the failure to resolve transport conflicts. Conflicts are situations wherein separate modules demand a robot within a time span insufficient for the robot to service these modules One conventional solution to the concerns listed above is the addition of extra process modules and transportation resources. However, the size limitations and geometrical constraints of a track system limit the possibility of resolving the above difficulties by adding additional process modules or transportation resources.

The addition of dedicated transfer arms to transfer substrates between adjacent modules (hereinafter called Inter Bay Transfer Arms, or IBTAs) is another method used to improve throughput and eliminate some of the pre-process and/or post-process times. However, the addition of IBTAs also has serious drawbacks. Dedicated transfer arms complicate the tool and increase its cost, constrain the position of the modules, and cannot be used everywhere in the tool. As a result, the tasks of managing the substrate flow in the track system while maintaining both high throughput and quality and resolving all transport conflicts become unmanageable.

Another conventional solution is to assign a set of substrate transport priority rules. Prior to any robot move, the control system, also referred to as the software scheduler, verifies the status of substrates in different modules and makes transfer priority decisions based on these rules. However, to achieve high throughputs, the scheduler may generate undesirable, unpredictable and variable pre-process and post-process times in critical modules, and the substrates may also be forced to follow different flow paths to complete their process cycle.

Yet another conventional solution is to add multiple grippers to robot, to enable wafer swapping. Multiple gripper robots are frequently used in the prior art in order to allow wafer swapping and minimize the number of robot transfers. However, this technique adds an additional constraint to the cluster tool, as a robot with dual grippers requires a wafer on one of the grippers in order to perform the swapping. This constrains the performance of the cluster tool. Furthermore, the swapping increases transport time between modules, which may also be deleterious to the performance of the cluster tool.

Heretofore, the requirements of conflict resolution, synchronization, quality, and path consistency referred to above have not been fully met. What is needed is a solution that simultaneously addresses all of these requirements.

SUMMARY OF THE INVENTION

The invention comprises a wafer cluster tool operation in periodic fashion. The cluster tool processes wafers loaded into the system at intervals of one sending period. Wafers are processed in a plurality of process chambers, and are transferred between process chambers by use of robots, or wafer transporters. Embodiments of the invention have a periodicity of one sending period.

The invention enables the determination of pick-up times for the process chambers, and embodiments of the invention allow the creation and maintenance of an updated timetable. The timetable indicates times when each of the process chambers is to be serviced. These values are updated as the process chambers receive new wafers.

Robots in the cluster tool may pre-position themselves in front of modules, or process chambers, to be served. Robot pre-positioning eliminates the wait time of individual modules beyond queue times which have been pre-determined for the modules. This renders the path of the individual robots pre-deterministic, enabling the cluster tool to utilize single gripper robots.

Some embodiments of the invention include a plurality of processing stations, wherein each processing station includes a process chamber and a local clock coupled to the process chamber. In such embodiments, the cluster tool also includes a master server in communication with the local clock in each processing station. The master server has a master clock, and timetable software which records a local time for each clock in the plurality of processing stations.

In some such embodiments, the wafer cluster tool also has a CPU coupled to the processing station, wherein the local clock coupled to the process chamber resides on the CPU. The wafer cluster tool may also include a local area network coupling the master server to each local clock. The timetable may take the form of a relational database or a spreadsheet. The master server, in turn, may be coupled to the local clocks via the Internet.

BRIEF DESCRIPTION OF THE FIGURES

FIG. 6 is a graph and corresponding table of module pick-up times which arise in a sending period, wherein the sending period is broken into 6 sub-intervals, as there are six possible robot moves within a single sending period.

FIG. 8 is a graph and accompanying tables and matrices, which illustrate the insertion of queues to eliminate conflicts between modules for access to robots.

Figure 1:
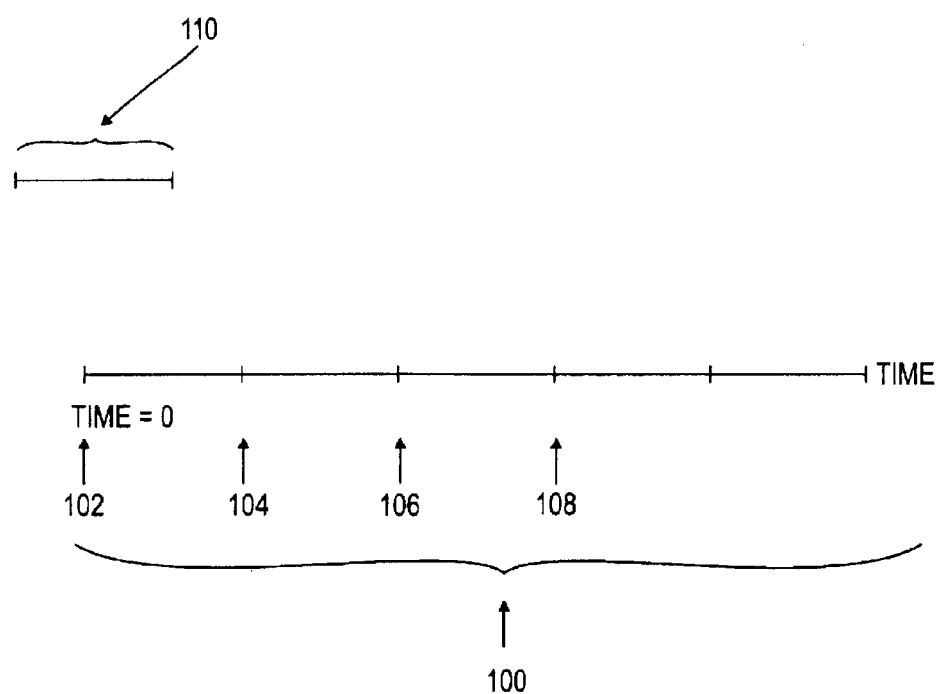
FIG. 1 is a time line illustrating the points at which wafers are loaded into a cluster tool, wherein the points are separated by intervals of one sending period.

DETAILED DESCRIPTION
Synchronized, Conflict Resolving Schedulers

An aspect of the present invention comprises a method for maximizing throughput and quality in a manufacturing system by scheduling events in the system in a periodic, predictable fashion which eliminates conflicts for system resources. An example of such a manufacturing system comprises a series of process steps 1, . . . , N, which are performed consecutively on individual units of manufacture. The individual process steps of the system are conducted in "modules", or "process chambers", and the series of steps is listed in a "recipe". The manufacturing system also includes resources for transporting the units of manufacture between modules in the series; these resources may include robots.

Conflicts may result between processes in the system when separate modules demand a robot within a time span which is insufficient for the robot to service these modules. Additionally, it is desirable to schedule the system in a manner which exhibits periodicity, so that events in the system are synchronized to occur at periodic, predictable intervals. An embodiment of the present invention includes a technique of selectively scheduling delays in various steps of the manufacturing process in order to eliminate all such conflicts, as well enforce periodicity, without degrading throughput or quality of the system.

An Example of Conflict-Resolving Synchronization: Wafer Cluster Tools

An example of the type of manufacturing system described above is a wafer cluster tool. In a wafer cluster tool, the modules comprise process chambers, which are organized around a group of wafer transporting resources, or robots, to perform a sequence of process steps on the wafer. A wafer enters and exits the tool through a buffer called a load port. Once a robot retrieves a wafer from a load port, the wafer is transported sequentially through the series of modules specified in a recipe. The time period defined by a wafer's entrance to a module and the wafer's exit from the module is referred to as a module process time. This process time includes the time actually spent processing the wafer in the module as well as the overhead time required to prepare the wafer for processing and pick up.

(note that though the wafer cluster tool is described above as passing an individual wafer between modules, it will be apparent to one skilled in the art that the present invention is equally applicable to a wafer cluster tool in which a discrete set of wafers is passed between modules.)

In certain modules of the cluster tool, a delay in picking up the processed wafer may adversely affect on-wafer results; such modules are identified as "critical process modules," as they cannot tolerate delays. The module whose process time is longest amongst all modules in the cluster tool is identified as the "gating module"; the process time at this module determines the throughput of the cluster tool. Because the gating module determines the throughput of the cluster tool, it too cannot tolerate delays. The recipe for a wafer cluster tool lists the modules in sequential order, alongside their respective process times. The time required by a robot to transport a wafer between two modules is referred to as its transport time.

Wafer Flow Management in the Cluster Tool

Wafer flow management, i.e., the orchestration of wafer processing and wafer transporting in a cluster tool, determines both the throughput and the on-wafer results delivered by the system. Effective wafer flow management requires the simultaneous satisfaction of the following two conditions: a wafer which was just processed in the sending module and is now ready to move should do so when (1) the receiving module in which the wafer will subsequently be processed is empty; and (2) the robot assigned to transport wafers between those modules is available. In the prior art, condition (1) was satisfied by providing additional redundant modules. Such a solution, however, compromises condition (2) in two ways: (a) it results in an inadequate number of robots serving too many modules or (b) two or more modules may compete simultaneously for the service of a robot.

When the two conditions listed above are compromised, delays in wafer pick-up result. If such delays occur at critical process modules, they adversely affect on-wafer results. And if such delays occur at the gating module, they slow down throughput. As such, it is imperative that the transport conditions listed above are guaranteed with respect to critical process modules and the gating module. In case (a) wherein more handling is required than the robots could provide, adding more robots can mitigate the situation. However, in case (b), the problem resides in the timing of the robot service request. While adding more robots can also alleviate case (b), this is an inadequate solution.

Since the recipe prescribed for the cluster tool determines the timings of the robot service request, a fundamental solution to resolving the two conditions can arise from altering the wafer recipe to synchronize with wafer transport. A scheduling algorithm described herein performs such synchronization.

This scheduler described herein can be encoded in software executed by a computer, wherein the computer comprises a memory for storing the software, and a CPU for executing the software. In an embodiment of the present invention, the scheduler may be used off-line from the manufacturing system to generate a pre-determined schedule for the system. Alternatively, the computer may be coupled to the manufacturing system so that the scheduler can update the operation of the system in real-time.

Synchronizing Wafer Flow in the Cluster Tool

In an embodiment of the present invention, wafer flow is synchronized by sending individual wafers through the cluster tool at a constant rate. This rate, referred to as the tool's "sending rate", is expressed in number of wafers per hour, and paces the wafer flow with a periodicity equal to (3600/sending rate) seconds. This period, referred to as the sending period of the cluster tool, is the heartbeat of the system. Individual wafer units are introduced to the system at intervals of one sending period. And in order to synchronize the cluster tool, all process and transport times are measured in units of sending period. Furthermore, to ensure that the same tasks can be repeated in succeeding periods, the robots in the cluster tool are scheduled to accomplish all service requests, hereafter referred to as "tasks", within a single sending period. As such, the synchronization of the cluster tool requires a determination of 1) the total number of tasks that are performed within a sending period and 2) the exact moment within a sending period that these tasks arise. These moments shall hereafter be referred to as the "timings" of the respective tasks.

The concepts of sending periods and synchronization are illustrated in FIG. 1. The timeline 100 has an origin 102, which denotes the moment when the first wafer is loaded into the cluster tool. The timeline 100 is demarcated in units of one sending period 110. Each demarcation 104, 106, and 108 indicates, respectively, the times at which the second, third, and fourth wafers are loaded into the cluster tool.

Figure 2:
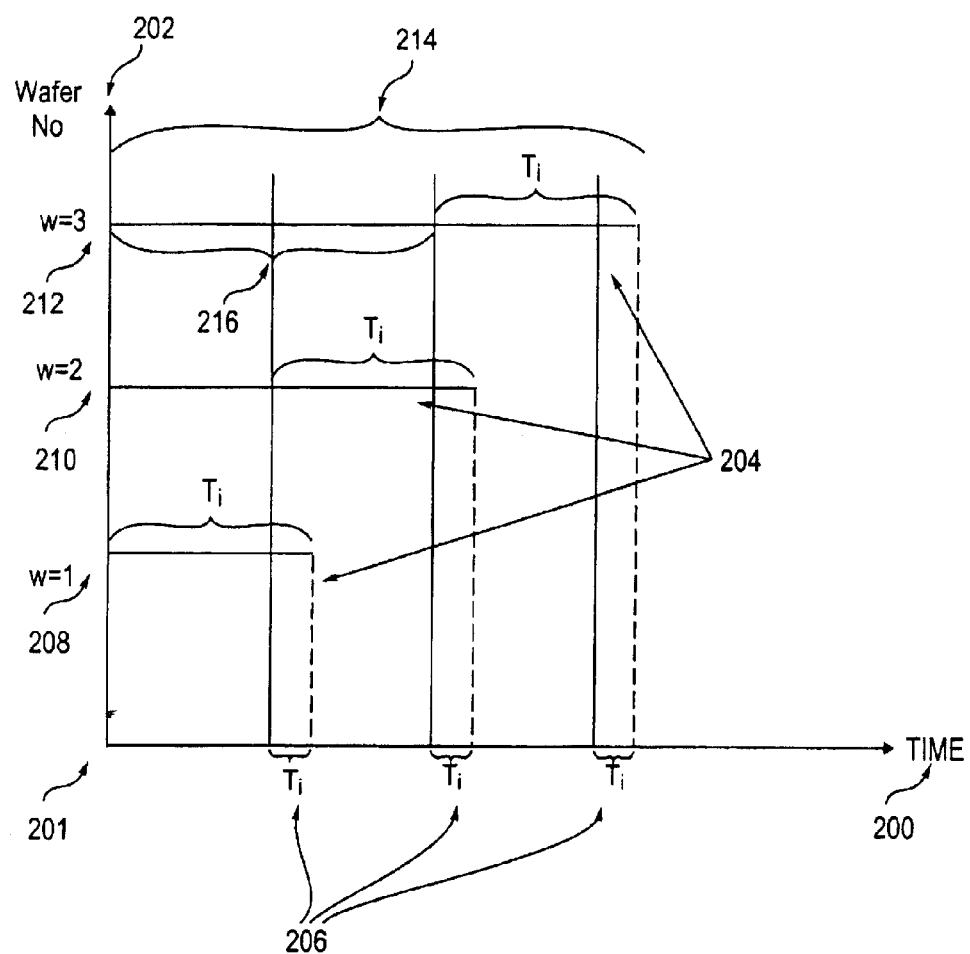
FIG. 2 illustrates the relative and absolute pick-up times of three wafers at a process i, as well as the mantissas of the pick-up times, wherein the pick-up times are normalized in terms of the sending period.

A principal characteristic of synchronization is periodicity: the present invention ensures that for each task i, i=1, . . . , n, the pick-up times for any wafer undergoing that task are identical. Thus each task i in the cluster tool can be associated with a relative pick-up time denoted $T_i$, where $T_i$ is normalized in units of the sending period. FIG. 2 depicts this feature of periodicity. Three wafers, wafer 1, 208, wafer 2, 210, and wafer 3, 212 are depicted on the vertical axis 202. The horizontal line depicts the TIME axis 200. The origin of this axis 201 indicates the time at which wafer 1 is loaded into the cluster tool. The relative pick-up times $T_i$ at task i 200 are identical for each wafer. Because the wafers themselves are introduced at intervals of one sending period, the actual pick-up times are separated by units of one sending period.

FIG. 2 also illustrates a distinction between relative and "actual" or "absolute" pick-up times. The relative pick-up time of a process i is denoted by $T_i$ 204. Since the relative pick-up time is measured from the time a wafer is introduced into the wafer cluster tool, the relative pick-up time is identical for each wafer, wafer 1, 208, wafer 2, 210, and wafer 3, 212. The absolute pick-up time 214 is measured from the moment the first wafer was loaded into the cluster tool 201. Since the wafers are introduced at intervals of one sending period, it follows that for any wafer no. w, the absolute pick-up time of wafer w at module i is $$(w-1)+T_i$$

This period (w−1) is illustrated in the FIG. 216.

Another parameter which is critical in synchronization is designated by the symbol $\tau_i$. The fraction $\tau_i = T_i - INT(T_i)$, where $INT(T_i)$ is a function that rounds $T_i$ down to the nearest integer, is the fraction of $T_i$ that has elapsed since the beginning of the current sending period. These parameters 206 are also illustrated in FIG. 2. Since the $T_i$ values are identical for each wafer, and since the wafers are inserted at intervals of one sending period, the values of $\tau_i$ 206 are identical for each wafer. These fractions, $\tau$, i=1, 2, 3 . . . N comprise the timings of the tasks the robots must accomplish within a sending period.

The number of tasks N and the timings of these tasks constitute the load of the transport. Since $T_i$ is the accumulation up to the ith module of the process times $p_j$, j=1,2,3 . . . i; and the robot transport times $t_j$, j=1,2,3 . . . i−1, it follows that for any wafer, the relative pick-up time at module i is:

$$T_i = \sum_{j=1}^{i} p_j + \sum_{j=1}^{i-1} t_j; \qquad i = 1, 2, 3 \ldots N$$

It also follows that the timing of the tasks, it $\tau_i$=1,2,3 . . . N; is $$\tau_i = T_i - INT(T_i) \qquad (1)$$
$$= \sum_{j=1}^{i} p_j + \sum_{j=1}^{i-1} t_j - INT\left(\sum_{j=1}^{i} p_j + \sum_{j=1}^{i-1} t_j\right); \quad i = 1, 2, 3 \ldots N$$

Since transport times $t_j$ are fixed for a given cluster tool, it is apparent from Equation (1) that the timing of robot task $\tau_i$ is dependent solely on the process times $p_i$ as prescribed by the recipe.

Periodicity and Wafer Identification

The property of periodicity also enables the identification of wafers in the cluster tool. As elaborated infra, the synchronized scheduler ensures that 1) the wafers are loaded into the cluster tool in sequential order at intervals of one sending period, and 2) each wafer loaded into the cluster tool undergoes identical events at the same times, as measured relative to the moment they are loaded. A consequence of these two conditions is that wafers enter and depart each module in the cluster tool in the order they were originally loaded, at intervals of one sending period. As such, each wafer in a module can be identified simply by tracking the order in which they entered or exited that module. This feature of the synchronized scheduler is referred to as wafer identification, or wafer "tagging".

Tagging and Module Paths

Figure 4:
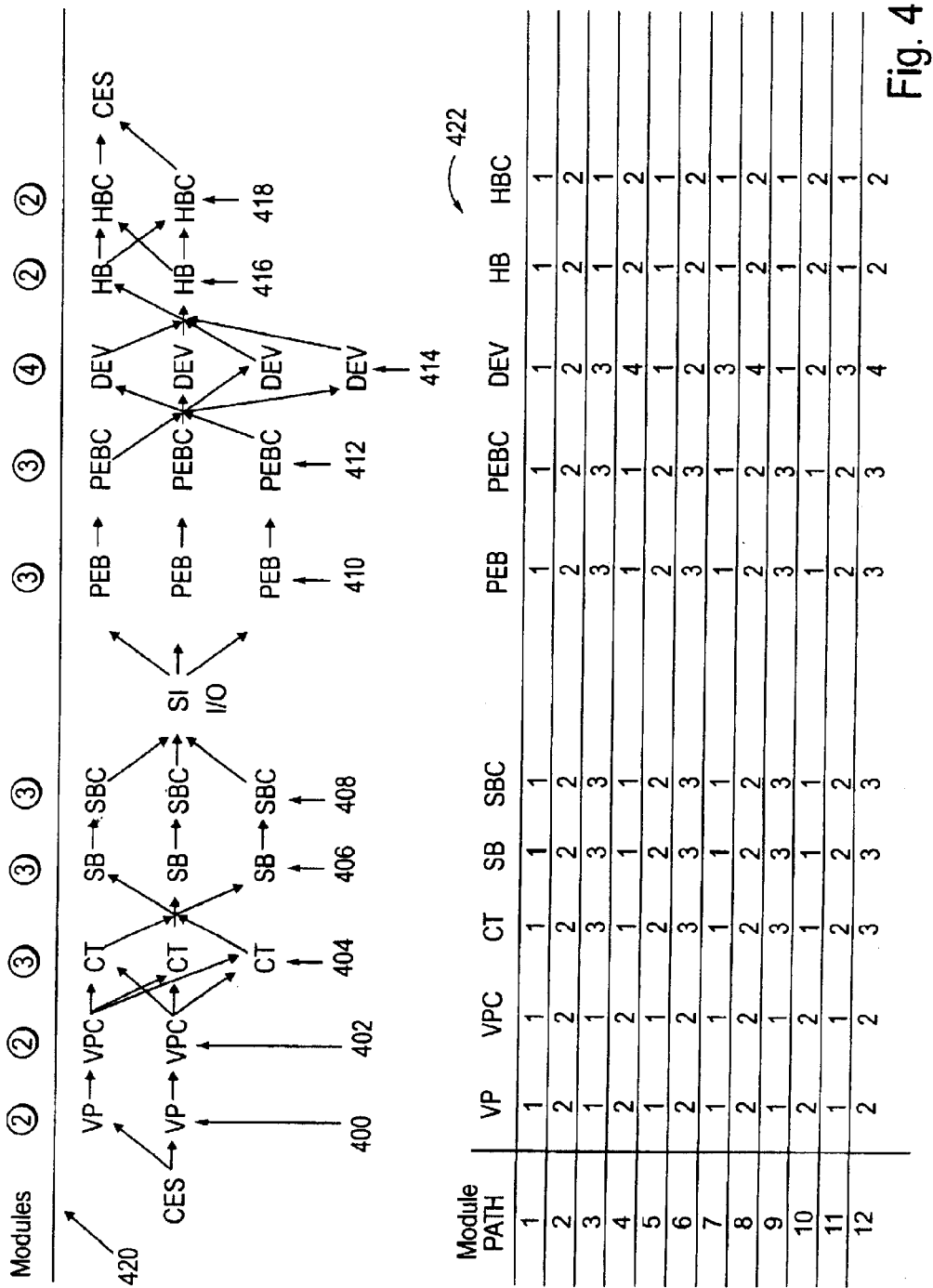
FIG. 4 is a graph and corresponding table illustrating the module paths in the cluster tool.

In an embodiment of the present invention, each wafer loaded into the cluster tool follows a particular "module path", i.e., a particular set of modules which correspond to the processes in the cluster tool. This feature of the present invention is illustrated in FIG. 4. In this embodiment, each process in the cluster tool has one or more modules associated with it, wherein the wafers are processed. The modules for each process are ordered in a sequence such that when wafers arrive at that process, they are placed in the corresponding modules in the sequential order (for e.g., if a process has two corresponding modules, the first wafer in the system goes to the first module, the second wafer goes to the second module, the third wafer enters the first module, the fourth wafer enters the second module, etc.) As a consequence, the total number of module paths that a wafer may follow is constrained to the least common multiple of the number of modules corresponding to each process.

The embodiment described above is illustrated by example in FIG. 4. FIG. 4 shows a sequence of process steps, VP 400, VPC 402, CT 404, SB 406, SBC 408, PEB 410, PEBC 412, DEV 414, HB 416, HBC 418. A symbol of a process step appears for each module corresponding to the process step. For instance, the process CT 404 has three modules, and corresponding, the symbol of CT appears three times 404. Above each process step is the number of modules for that process step 420.

In this example, the least common multiple of the number of modules is:

$$LCM(2,2,3,3,3,3,3,4,2,2)=12$$

Hence, the recipe for the cluster tool prescribes twelve module paths, which are listed 422. Each column in the table 422 lists the module number for that process step in the respective module path. As there are twelve possible paths, every twelfth wafer follows the same module path. As such, by identifying a wafer and the order in which it was loaded into the tool, the present invention enables the determination of the module path followed by the wafer.

Adding Queues to Eliminate Conflicts for Transportation Resources

If a recipe gives rise to simultaneous, competing service requests for particular robots, it would be desirable to resolve the conflicts not by adding more robots, but rather by modifying the recipe itself One convenient scheme to modify the recipe is to introduce deliberate delays, hereafter called queues $q_j$, to the non-critical process steps in order to achieve timing which resolves conflicts without compromising the throughput or on-wafer results delivered by the tool. Such a scheme, used in conjunction with Equation (1), is the basis for the "synchronous algorithm." To recap, a recipe as originally prescribed may introduce competing service requests which result in delays at critical process and gating steps, thereby degrading the wafer quality and throughput of the single-wafer cluster tool. The aim of "synchronous algorithm" is to insert intentional delays at non-critical process steps in order to ensure that no delays occur at critical process steps or gating steps, and thereby ensure guarantees of throughput and wafer quality.

Solving for the Queues

We shall now demonstrate how to solve for the delays, or $q_j$. Let $\tau$ be the timing of robot tasks as dictated by a prescribed recipe per Equation (1). By adding queues $q_j$ to the process time $p_j$ to modify the recipe, the new timing $\tau_i^*$ is given by:

$$\tau_i^* = \sum_{j=1}^{i}(p_j+q_j) + \sum_{j=1}^{i-1} t_j - INT\left(\sum_{j=1}^{i}(p_j+q_j) + \sum_{j=1}^{i-1} t_j\right) \quad (2)$$

$$= \tau_i + \sum_{j=1}^{i} q_j - INT\left(\sum_{j=1}^{i}(p_j+q_j) + \sum_{j=1}^{i-1} t_j\right) +$$

$$INT\left(\sum_{j=1}^{i} p_j + \sum_{j=1}^{i-1} t_j\right)$$

The objective is to find a set of queues $q_i$ to be inserted at the non-critical process steps such that the time interval between any two modules k and m, k=1,2,3, ... N; and m=k, k+1, ... , N, where module k and module m are assigned to have their wafers picked up by the same robot, is greater than the transport time of the robot. This would allow for time intervals sufficient for the robot to service all modules and thus avoid having to serve more than one module at a given time. However, the queues so derived must also be small enough to avoid excessive idling of modules. And there should be no queues at critical process modules or the gating module.

The set of queues will be solved for using Equation (2). This yields a system of linear equations $$(\tau_i^* - \tau_i) = \sum_{i=1}^{N} a_{ij} q_j;$$

where $a_{ij}$ is a lower triangular matrix with $a_{ij}=0$, for $i<j$; and $a_{ij}=1$, for $i \geq j$:

$$\begin{bmatrix} \tau_1^* - \tau_1 \\ \tau_2^* - \tau_2 \\ \tau_3^* - \tau_3 \\ \tau_4^* - \tau_4 \\ \dots \\ \tau_{N-1}^* - \tau_{N-1} \\ \tau_N^* - \tau_N \end{bmatrix} = \begin{bmatrix} 1 & 0 & 0 & 0 & 0 & 0 & 0 & 0 \\ 1 & 1 & 0 & 0 & 0 & 0 & 0 & 0 \\ 1 & 1 & 1 & 0 & 0 & 0 & 0 & 0 \\ 1 & 1 & 1 & 1 & 0 & 0 & 0 & 0 \\ \dots & \dots & \dots & \dots & \dots & \dots & \dots & \dots \\ 1 & 1 & 1 & 1 & 1 & 1 & 1 & 0 \\ 1 & 1 & 1 & 1 & 1 & 1 & 1 & 1 \end{bmatrix} \times \begin{bmatrix} q_1 \\ q_2 \\ q_3 \\ q_4 \\ \dots \\ q_{N-1} \\ q_N \end{bmatrix} \quad (3)$$

The constraint that no delays should occur at critical modules is now applied to Equation (3). For example if module #3 and #4 are critical, Equation (3) should be modified to the linear equations as shown below.

$$\begin{bmatrix} \tau_1^* - \tau_1 \\ \tau_2^* - \tau_2 \\ 0 \\ 0 \\ \dots \\ \dots \\ \tau_{N-1}^* - \tau_{N-1} \\ \tau_N^* - \tau_N \end{bmatrix} = \begin{bmatrix} 1 & 0 & 0 & 0 & 0 & 0 & 0 & 0 \\ 1 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ \dots & \dots & 0 & 0 & \dots & \dots & \dots & \dots \\ \dots & \dots & 0 & 0 & \dots & \dots & \dots & \dots \\ 1 & 1 & 0 & 0 & 1 & 1 & 1 & 0 \\ 1 & 1 & 0 & 0 & 1 & 1 & 1 & 1 \end{bmatrix} \times \begin{bmatrix} q_1 \\ q_2 \\ q_3 \\ q_4 \\ \dots \\ \dots \\ q_{N-1} \\ q_N \end{bmatrix} \quad (4)$$

In Equation (4) above, the timings $\tau_i$ as prescribed by the original recipe are known. The target timings $\tau_i^*$ are set to values which eliminate conflicts between all modules using the same robot, as described earlier. Thus LHS of Equation (4) are known values. The vector $q_i$ is then solved for by pre-multiplying $(\tau_i^* - \tau_i)$ with the inverse of the modified constraint matrix as shown in Equation (5) below. Adding this set of $q_i$ to the corresponding module process time $p_i$ will synchronize wafer transport with wafer process.

$$\begin{bmatrix} q_1 \\ q_2 \\ q_3 \\ q_4 \\ \vdots \\ \vdots \\ q_{N-1} \\ q_N \end{bmatrix} = \begin{bmatrix} 1 & 0 & 0 & 0 & 0 & 0 & 0 & 0 \\ 1 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ \cdots & \cdots & 0 & 0 & \cdots & \cdots & \cdots & \cdots \\ \cdots & \cdots & 0 & 0 & \cdots & \cdots & \cdots & \cdots \\ 1 & 1 & 0 & 0 & 1 & 1 & 1 & 0 \\ 1 & 1 & 0 & 0 & 1 & 1 & 1 & 1 \end{bmatrix}^{-1} \times \begin{bmatrix} \tau_1^* - \tau_1 \\ \tau_2^* - \tau_2 \\ 0 \\ 0 \\ \vdots \\ \vdots \\ \tau_{N-1}^* - \tau_{N-1} \\ \tau_N^* - \tau_N \end{bmatrix} \quad (5)$$

An Application of the Synchronous Algorithm

Specific embodiments of the invention will now be further described by the following, nonlimiting example which will serve to illustrate in some detail various features of significance. The example is intended merely to facilitate an understanding of ways in which the invention may be practiced and to further enable those of skill in the art to practice the invention. Accordingly, the example should not be construed as limiting the scope of the invention.

Figure 3:
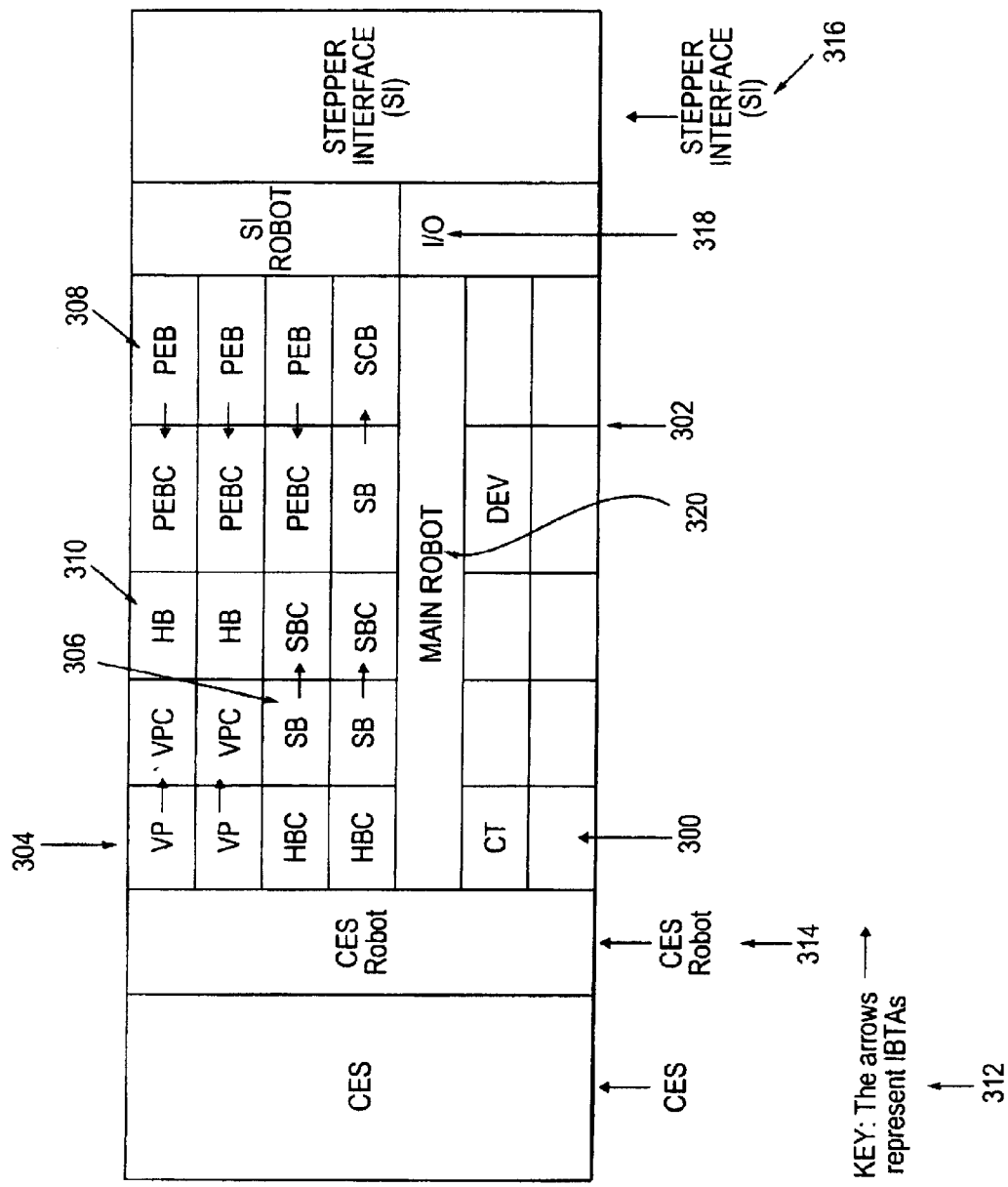
FIG. 3 illustrates the various modules and transportation modules in the cluster tool.

The synchronization of wafer transport with wafer process in a cluster tool will now be illustrated using a specific example of a cluster tool. FIG. 3 is a schematic for a conceptual plan view of a wafer processing apparatus. The resist coating and developing modules are identified as CT 300 and DEV 302 respectively. Also shown in FIG. 3 are the different bake modules vapor prime (VP) 304, soft bake (SB) 306, post exposure bake (PEB) 308, and hard bake (HB) 310, as well as their corresponding chill modules. The arrows connecting adjacent bake and chill modules represent the inter bay transfer arms, IBTAs 312, that transfer the substrate between these modules. As a result, the locations of these bake modules constrain the location of their corresponding chill plate. The cassette end station (CES) robot 314 shown in the figure transfers substrates from and to the cassette end station. The stepper interface (SI) robot 316 transfers substrate from and to the stepper interface. The I/O module 318 is a buffer zone for the substrate transported to the stepper interface if and when it becomes necessary. The main robot 320 is the means to transport the substrate between all other modules such as vapor prime chill (VPC) to resist coat (CT.)

FIG. 4 is a schematic for the wafer process flow. As can be seen from the schematic, when the transport means is the IBTA the substrate will have only one option in the flow diagram. This is the case when the substrate is transported from a vapor prime bake 400 to vapor prime chill 402. However, when the transport means is the main robot the substrate could have several options. For example, when a substrate is removed from a resist coat module 404, it can be transported to any of the soft bake modules 406 shown in FIG. 4.

The Synchronization Algorithm

Figure 5:
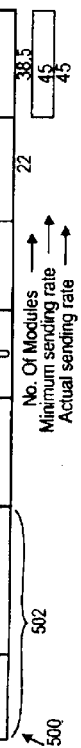
FIG. 5 is a table illustrating the recipe of a cluster tool.

We will now demonstrate the application of the synchronization algorithm to this cluster tool as a series of four steps:

Step 1 Input The Recipe And Throughput Requirement. This discussion refers to FIG. 5. This step commences by inserting the recipe in a table 500. The first two columns 502 list the process steps in sequential order. The sending period, also referred to as the "system takt time" is also noted 504. Cycle times, also known as module takt times, are then calculated for each module in the "Module type" column 502 to ensure each module takt time is less than the system takt time. The module takt time for each process step is listed in a column 506. If not, redundant modules are added to reduce module takt time. As will be clear to one skilled in the art, for each process step:
No. Modules Required=INT (Module takt time/System takt time)
In this example, most modules require one additional redundant module. The number of modules required for each process step is listed in a column 508.

Figure 7:
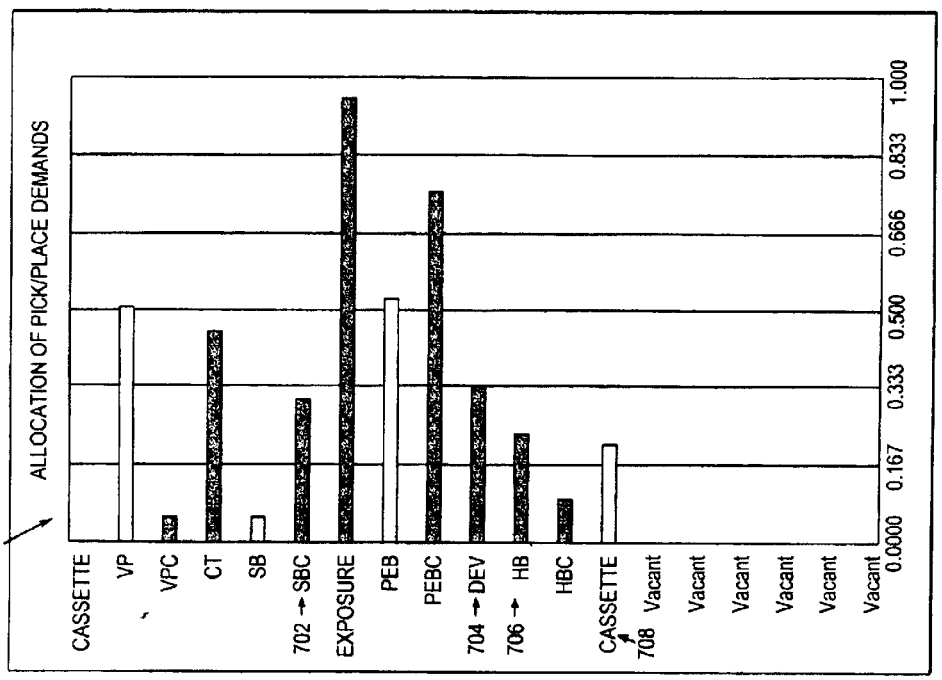
FIG. 7 is a graph and corresponding table illustrating conflicts that arise between processes for access to robots, wherein conflicts are indicated when two modules assigned to a robot have pick-up demands within a single period.

Step 2 Determine The Load of The Wafer Transport. As defined earlier, the "load" of a robot refers to the number of moves it is scheduled to make as well as the times allotted for the robot to perform these moves, as measured from the beginning of the current sending period. The determination of the robot load is depicted in the table 600 in FIG. 6. This cluster apparatus of this example has twelve process steps. The timings of the twelve corresponding robot moves are determined as follows. Counting the time from the moment the wafer leaves the load port (cassette), cumulate the process times of each module and transport times up to the module of interest. For example, for the module code-named VP 602 (hereafter all modules are coded), it is (62+6)=68 sec; for module VPC 604, it is (68+65+5)= 138 sec. The actual timings in seconds for all robot moves are listed in a column marked "Actual" 606. To determine the relative pick-up times $T_i$, the actual times are divided by the actual sending period. For example, dividing the actual pick-up times of VP and VPC by the actual sending period of 45 sec results, respectively, in normalized pick-up times 1.511 and 3.067. The normalized pick-up times for each of the twelve process steps are listed under the column "$T_i$ Normalized" 608. Subtracting the integer portion of the $T_i$ values results in the $\tau_i$ values, i.e., the available time the respective modules have to be served by robots, as measured from the beginning of sending period, and expressed in units of one sending period. To illustrate, the $\tau_i$ values of VP and VPC are 0.511 and 0.067, which indicates that VP must be serviced within 0.511 intervals of one sending period, and VPC must be serviced within 0.067 intervals of one sending period. The list of normalized $\tau_i$ values are listed in a column 610. The diagram 612 is a pictorial representation of the load: a total of twelve moves and the time they have to be served within a sending period. FIG. 7 shows the same information from another perspective. Since the robot transport times are around 5 & 6 seconds, the number of moves one robot can make within a sending period of 45 sec is (45/6)~7; say 6 moves to be on the conservative side. Thus 6 vertical lines are drawn in the graph 700. When the times the modules have to be served by a robot fall within one interval, such as SBC 702, DEV 704, HB 706, and Cassette 708, all of which fall into one interval 710, it means that they are competing for the same move of the robot at a given time. To elaborate, if there are two or more tasks which use one robot, and if the $\tau$ values of these tasks fall into one of the 6 intervals, it means that there is insufficient time for the robot to service each of the two or more robots.

These "conflicts" between the tasks for use of the robots are resolved as described in the subsequent steps.

Step 3 Allocate The Transport Load. The first step to resolve conflicts in the manufacturing system is to allocate the load equally among robots in order to achieve a balanced transport load. Although conflicts are recipe dependent, assigning fewer loads per robot still reduces the chance for conflict. However, the possibility of balancing the load is dependent on the layout of the modules relative to robots. Poor layout limits accessibility to modules by robots and makes balanced loads difficult to attain. In this example, the layout is such that two robots, CES and SI, can each only serve two modules, leaving the bulk of the load to the main robot C–1 and three dedicated robots known as IBTA (Inter Bay Transfer Arm). The best allocation of transport load, under the constraints of the layout, is as shown in FIG. 7. Six modules, VPC 712, CT 714, SBC 716, PEBC 718, DEV 720, and HB 722 are allocated to the main robot C–1 with three of them, SBC, DEV and HB competing for one move of the robot, as discussed earlier. These conflicts will be resolved by queuing as demonstrated in the next step.

Figure 8:
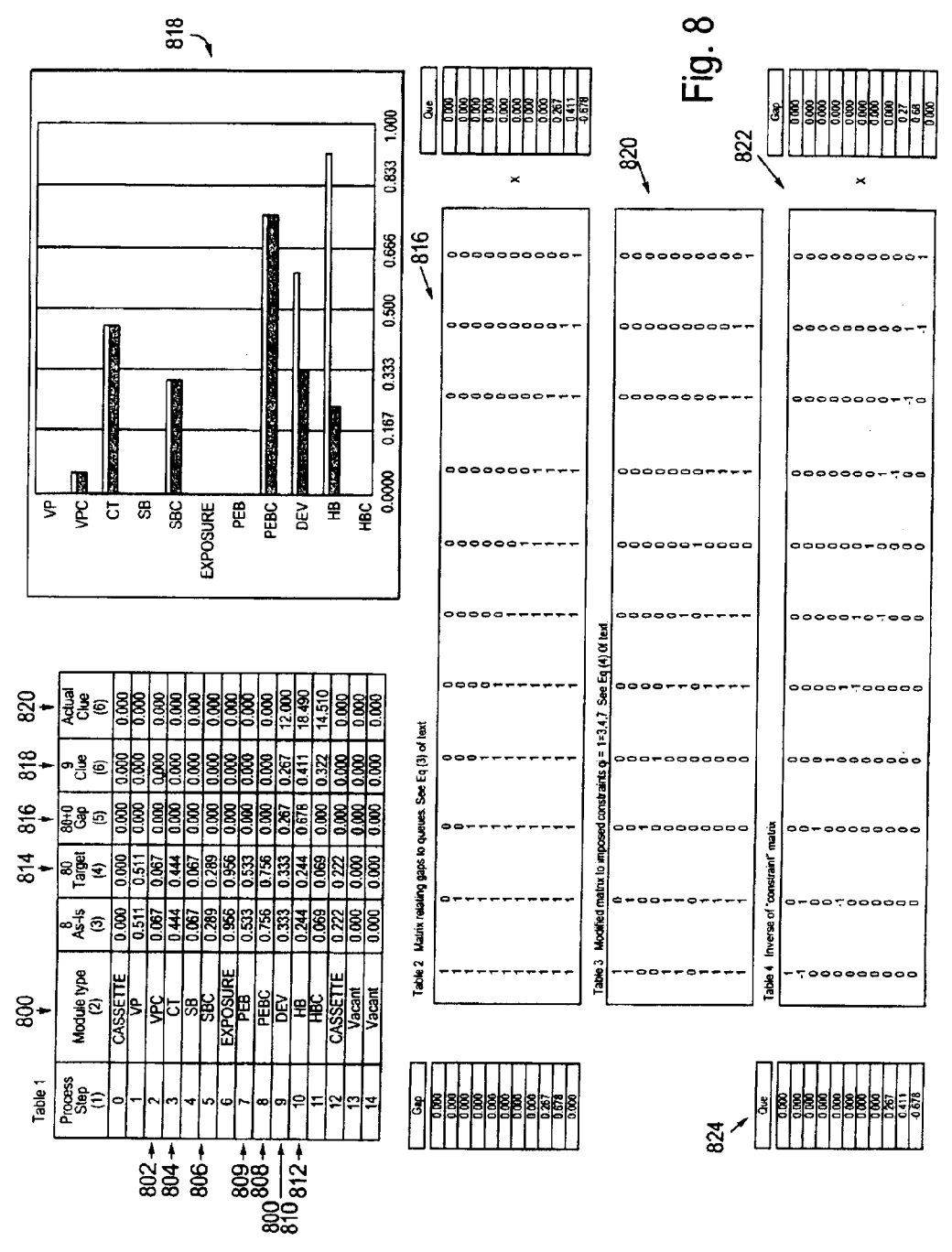

Step 4 Queuing For Synchronization. The information in the table 800 of FIG. 8 is a summary of load allocation from Step 3. Only the six modules served by main robot C–1, i.e., VPC 802, CT 804, SBC 806, PEBC 808, DEV 810, and HB 812, need to be considered for queuing. The remaining modules should not experience conflicts since each has dedicated robot, i.e., an IBTA, serving them. In the Target Column 814, the target timing profile is set for the 6 modules. For each of the modules listed in the table, a corresponding value is set for $\tau^*$, where $\tau^*$ is an updated value for $\tau$ which eliminates conflicts between tasks for robots. Since only 3 of these 6 modules, SBC 806, DEV 810, and HB 812 are in conflict, only two, DEV and HB, need to have timing targets different from the original values for $\tau$ prescribed by the recipe, The timing targets are listed in a column 814, and are set such that the timing interval between any pair of the 6 modules is larger than robot transport time (=6/45~0.1333). The differences between the target and the originally prescribed timing profiles are referred to as the gaps and are computed the column 816. These are shown pictorially in the graph 818 adjacent to the table. Another objective of the "synchronous algorithm" is to ensure that no delays are introduced at critical process steps. In this example, critical process steps are step 3, 804, step 4, 806, and step 7, 809. No queues should be added to modules corresponding to these steps, i.e., the target timing for these modules should be the same as the prescribed values. The gaps computed in the Gap column 816 may now be substituted in to Equation (3) to solve for the queues that will close these gaps. However, to ensure zero delays at the critical process modules, the matrix 818 relating gaps and queues must be modified per Equation (4) to generate a modified matrix 820. Pre-multiplying the gaps from the Gap column 816 with the inverse of the modified matrix 822 produces the queues needed to close the gap 824. The solution for the queues is transferred to a Que Column 826. The solution, which is in units of the sending period, is converted to actual time in an Actual Que Column 828.

Step 5 Check The Solution. The queues determined in Step 4 are now added to the module processing time of the original recipe. This is to verify if conflicts have been resolved. This is in fact the case as shown in the figure.

Robot Assignment

Another aspect of the scheduling problem, which merits automation, is the assignment of robots to modules. For example, in step three listed above, a recipe was chosen which assigned a single robot between each pair of consecutive models; this allocation is shown in the recipe listed in FIG. 7. The allocation was chosen amongst many possible allocations.

In general, there is a need for an algorithm that determines an optimal robot assignment prior to the determination of queues. The need for such an algorithm will be demonstrated in the following example. Suppose we have a simplified track system, consisting of three modules, labeled Mod1, Mod2 and Mod3. Suppose we have two robots, Robot1 and Robot2, both of which can service all three modules. Let the sending period be designated by the variable SP. Suppose $\tau_1=0.0$, $\tau_2=0.6$, $\tau_3=0.7$, in units of the sending period, and suppose the robots can move in 0.3, in units of SP. There are four possible robot allocations:

| Assignment | Mod1 to Mod2 | Mod2 to Mod3 |
|---|---|---|
| 1. | Robot1 | Robot1 |
| 2. | Robot2 | Robot2 |
| 3. | Robot1 | Robot2 |
| 4. | Robot2 | Robot1 |

Upon inspection, only assignments 3 and 4 are viable. In assignments 1 and 2, the time interval between $\tau_2=0.6$ and $\tau_3=0.7$ is 0.1 sending periods, which is less than the 0.3 sending periods required for a robot to move. Hence the optimal allocations are, in this case, assignment #3 and #4; as the time intervals between the □□ values have sufficient distance, this robot assignment obviates the need to insert delays. Other criteria may also enter into the determination of an optimal robot assignment, for instance, balancing loads, increasing throughput. An algorithm is necessary which would determine, in cases more complicated than the simplified example above, an optimal robot assignment.

One method of performing such an assignment is simply an exhaustive technique: generate all possible robot assignments, and determine the validity of each assignment, i.e., ensure that all modules assigned to a robot differ sufficiently in their $\tau$ values to permit the robot to service them. The assignments thus generated may also be selected on additional criteria, such as load balancing.

Solving for Updated Timings ($\tau^*$)

Another feature of the synchronization that merits automation is the derivation of the updated timings, given by $\tau^*$. To elaborate, in step 4 of the algorithm outlined earlier, the algorithm was fed updated values of $\tau^*$, where for any two modules which shared a robot, the respective $\tau^*$ values differed by enough time to allow the robot to move between them. There is a need for an automated method of deriving these $\tau^*$ values. One such technique is as follows:

For each robot with a conflict, take the $\tau$ value for each of its modules.

For each combination of these $\tau$ values, sort the $\tau$ values from lowest to highest. For each sorted list of $\tau$ values:

Proceed sequentially through the $\tau$ values, from lowest to highest.

Determine the difference between the given $\tau$ value and the one that precedes it If the difference is less than the time allotted for the robot to move, increment the $\tau$ value sufficiently.

Go to next $\tau$ value.

When this algorithm finds an updated set of $\tau$ values for a given robot that eliminates conflicts, these become $\tau^*$ values. It can be proven that if a conflict-free group of $\tau^*$ values exist, the algorithm outlined above will find it.

Genetic Algorithms

The synchronization, robot assignment, and derivation problems can also be solved by use of a genetic algorithm (GA). A GA is an iterative process that starts out with an initial population of genes, which encode possible states of the problem. This population is systematically improved with each iteration, through a process of selective breeding. To perform selective breeding, the GA needs to a) define the characteristics of a species, and b) judge a species' fitness.

Characteristics of a Species A specie is characterized by n genes. For our problem, we use two types of genes, one to represent the robot assignment, and the other, a queue segment. Consider the example used in the description of the earlier algorithm. The robot assignment will range from 1 to 4, indicating which robot will work on a particular module. Queue segment is also an integer indicating how many "time zones", i.e., robot move periods, are to be added to a module's arrival time in order to avoid conflict in robot assignment. In our earlier example, the modules arrive in six different time zones, as shown in FIG. 6, 612. If a time zone sees the arrival of, for instance, five modules, a conflict results. The addition of a queue segment to one of the modules will push the arrival time to the next time zone and hence resolve the conflict.

Fitness of a Species We can measure fitness by the reciprocal of a species 'badness'. In turn, badness can be measured by a weighted sum of the degree of conflict and the number of added queue segments. An ideal species is one that has no added segments, and results in no conflict in robot assignment.

To derive the fitness function, we scan each time zone and count the number of redundant assignments for each robot. The results are summed for all robots and all time zones. Call this sum s. We proceed to count the number of added queue segments, and call it t. The fitness function is then $$f(s, t) = \frac{1}{(1 + w_1 s + w_2 t)};$$

where the weights $w_1$ and $w_2$ are assigned according to the relative importance of s over t.

Recipe Cascading

An embodiment of the invention allows the cluster tool to change from a first recipe to a second recipe, while preserving periodicity, and ensuring that there are no delays at critical points. This procedure is referred to as recipe cascading. Cascading involves emptying a first lot of wafers, hereafter called the exiting lot, off a cluster tool, and simultaneously and serially populating the cluster tool with another lot of wafers, hereafter called the entering lot. The procedure will be performed with no delays incurred at critical process steps; and with no additional robots and process modules other than those called for by the recipe and throughput requirements of the entering and the exiting lots. The entering lot may also have different recipe and throughput requirements from the exiting lot.

Notation

The following parameters will be employed in our discussion of recipe cascading:

$m^{ex}$=number of process steps, superscript (en, ex) hereafter denotes entering or exiting lot.

$n^{ex}$=number of exiting wafers to fully empty, or of enter wafers to fully populate the cluster tool.

$SP_i^{ex}$=Send period of the ith wafer which is the time interval between the launching of the (i−1)th and ith wafer.

$SP_{\cdot}^{ex}$=Send period of the wafers during steady state.

$SP_{1st,j}^{en}$=The delay in the launching of the 1st wafer of the entering lot to accommodate the change-over at the jth process module of the exiting lot.

$CO_j$=Time it takes to change the jth process module of the exiting lot over to a new setting.

$T_{ijk}^{in}$=The arrival time of the ith wafer at the jth module transported by the kth robot.

$T_{ijk}^{out}$=The departure time of the ith wafer from the jth module transported by the kth robot $p_j^{ex}$=Process time of jth process step of the exiting lot.

$t_j^{ex}$=Transport time between j−1)th and jth process step of the exiting lot.

$q_{ij}^{ex}$=queues added to the ith wafer at the jth process step of the exiting lot.

Nature of Recipe Cascading

Figure 9:
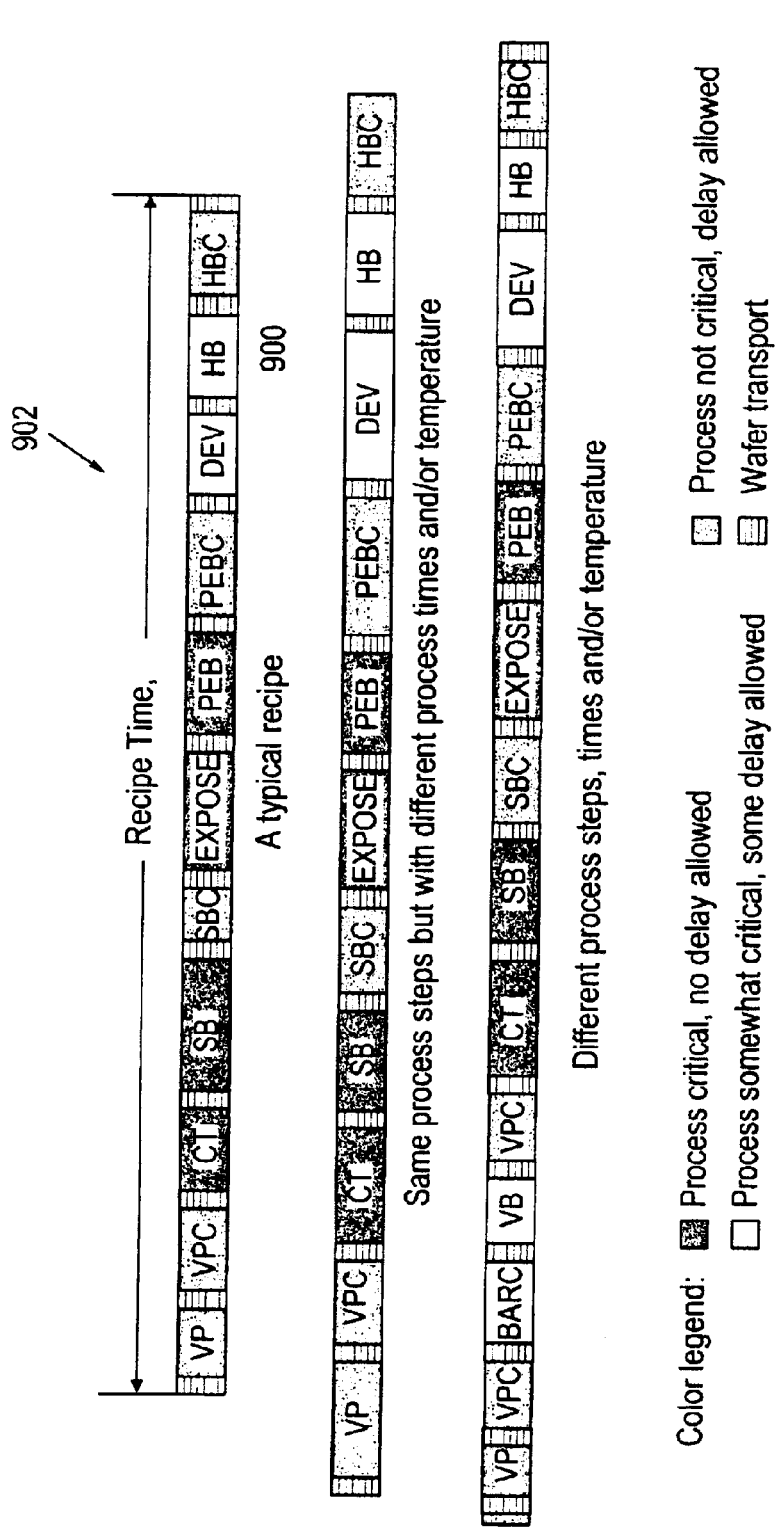
FIG. 9 illustrates recipes and recipe times in a cluster tool.
Figure 10:
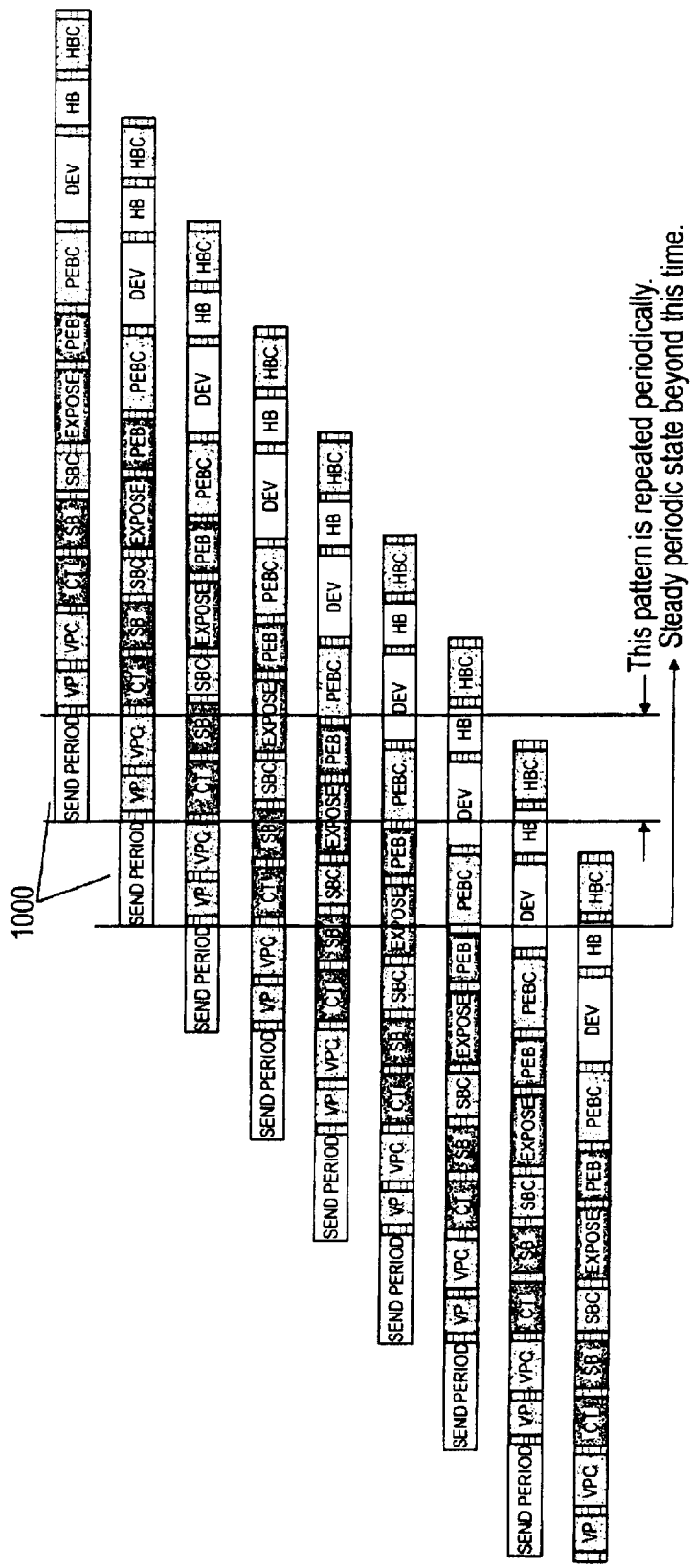
FIG. 10 illustrates wafer flow in steady state in a cluster tool.

FIG. 9 illustrates a typical recipe 900. It specifies the process and transport tasks and the timing of each task to be performed on a wafer as the wafer goes through a cluster tool. To satisfy throughput requirement, succeeding wafers are sent through the cluster tool at a constant send period, as illustrated in FIG. 10. This send period SP 1000 is given by $$SP = \frac{3600}{WPH}$$

where WPH is the throughput requirement in wafer per hour.

By the nth wafer, the cluster tool will be fully populated with wafers. For every wafer exiting the cluster tool, there is a wafer entering to replenish it. All process and transport tasks performed on the wafers occur in a periodic fashion, the periodicity being delimited by the send period. When the system reaches this stage, it is said to be in steady state. The number of wafers n required to fully populate the cluster tool and ramp up to a steady periodic state is given by the expression $$n = 1 + INT\left(\frac{\pi}{SP}\right); \tag{A}$$

where π is the total process and transport time performed on a wafer as indicated in FIG. 9, 902. The symbol INT(•) denotes a fixation that rounds a number down to the nearest integer. The above equation also applies for the number of wafers for a lot to ramp down from a steady state and fully empty out the cluster tool. In the steady state, every wafer has identical process and transport tasks performed on it at identical time intervals. There is therefore no need to keep track of the movement of wafers inside the cluster tool.

Figure 11:
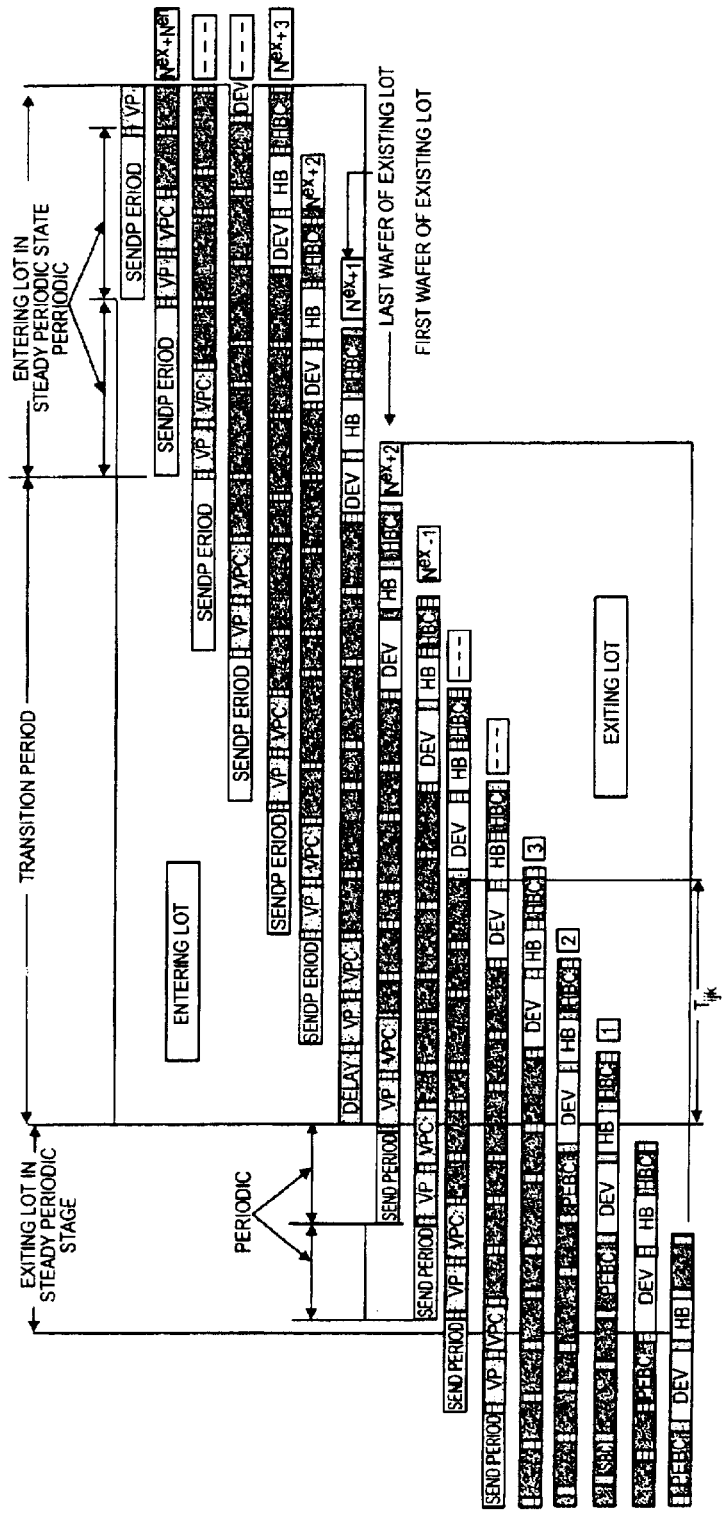
FIG. 11 illustrates a transition period, in which the cluster tool processes an entering lot and an exiting lot.

During the recipe cascading, however, the wafers are in transition from the steady state of the exiting lot to the steady state of the entering lot, as illustrated in FIG. 11. During the transition, some wafers will be processed and transported according to the recipe and send period prescribed for the exiting lot; others, will be processed and transported according to the recipe prescribed for the entering lot. Periodicity therefore can not be maintained. "Conflicts" will occur. "Conflicts" refer to two situations. In one situation called process conflict, two wafers have to be processed sequentially by the same process module within an interval shorter than the process time of that step. In the other situation called transport conflict, two wafers have to be transported sequentially by the same robot within an interval shorter than the robot transport time.

One solution to conflicts is to add more modules and robots. This solution is costly and not practical. Another solution is to devise a set of priority rule and implement "if-then" algorithm to react to the conflicts. Because of its combinatorial nature, this solution generates huge combination of outcomes that eventually lead to chaos and unpredictability. The fundamental solution is to eliminate conflicts completely through proper timing in launching wafers of the entering lot and insertion of intentional delays at the non-critical process steps of both the exiting and entering lot. This is the principle behind recipe cascading described herein.

Procedure

Step 1: Estimate the number of wafers in transition. During transition, the exiting lot is emptying while the entering lot is populating the cluster tool. The number of wafers involved in the transition can be estimated by using Equation (A). The algorithm for the estimation is as follows.

$\pi^{ex}=0$

For $i=1, 2 \ldots m^{ex}$ $\pi^{ex}=\pi^{ex}+p_i^{ex}+t_i^{ex}$

Next i $n^{ex}=INT(\pi^{ex}/SP_*^{ex})$ $\pi^{en}=0$

For $i=1, 2 \ldots n^{en}$ $\pi^{en}=\pi^{en}+p_i^{en}+t_i^{en}$

Next i $n^{en}=INT(\pi^{en}/SP^{*en})$

Figure 12:
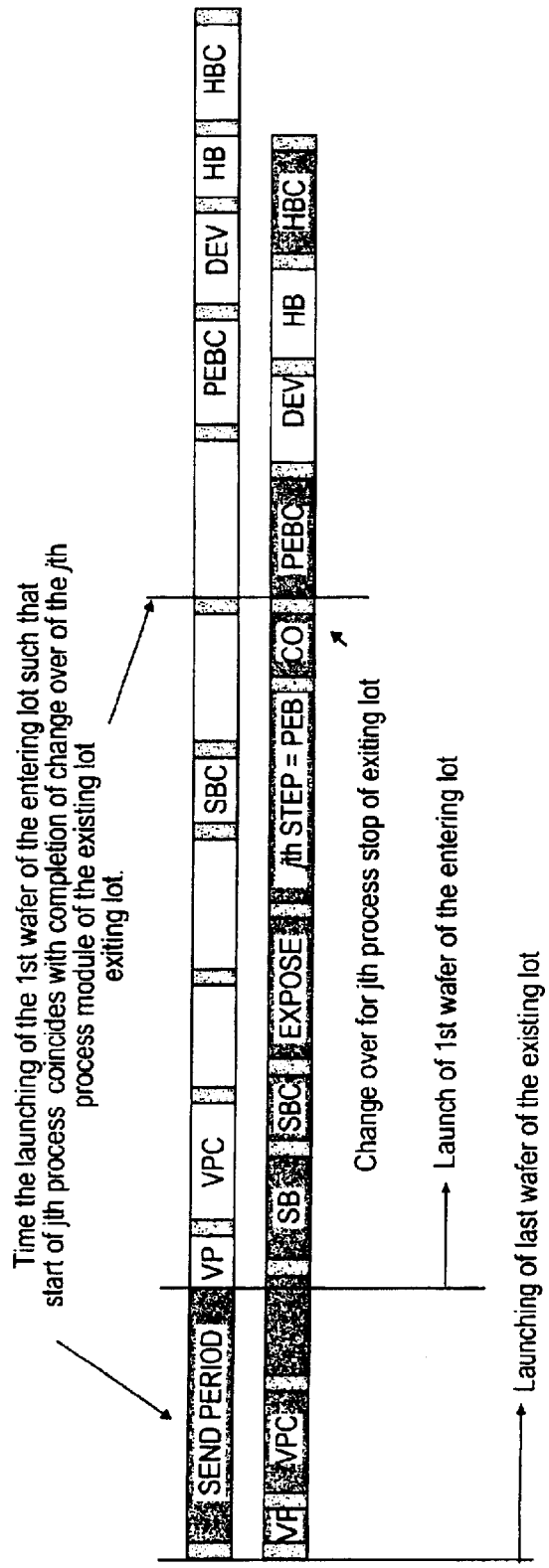
FIG. 12 illustrates the timing of the first wafer of the entering lot in the cluster tool according to an embodiment of the invention.

Step 2: Estimate the lower bound of "delay". The timing of launching the wafers of the entering lot is a primary variable responsible for conflict occurrence. Therefore proper timing of the launches is important. Additionally, the timing of launching the first wafer, hereafter called the "delay", should be such that it provides the time needed to change a process module over to a new setting called for by the entering lot. So that when the first wafer of the entering lot arrives, the change over is complete and the process module is ready to accept it. There will be as many "delays" as the number of module change over called for by the recipe of the entering lot. The maximum of them is the lower bound of the delay. Any amount of delay contemplated for conflict resolution must be greater than the lower bound. Referring to FIG. 12, the lower bound can be derived as follows.

$$SP_{1st,j}^{en} + \sum_{l=1}^{j-1}(p_l^{en}+t_l^{en}) = CO_j + \sum_{l=1}^{j}(p_l^{ex}+t_l^{ex}) \quad (B)$$

$$SP_{1st,j}^{en} = CO_j + \sum_{l=1}^{j}(p_l^{ex}+t_l^{ex}) - \sum_{l=1}^{j-1}(p_l^{en}+t_l^{en})$$

$SP_{1st,*}^{en} = \max(SP_{1st,1}^{en}, SP_{1st,2}^{en}, SP_{1st,3}^{en}, \ldots SP_{1st,j}^{en}, j=1, 2, \ldots m^{en},)$ The following is the algorithm for estimating the lower bound of delay per Equation (B)

For $j=1, 2 \ldots m^{en}$ $SP_{1st,j}^{en}=CO_j$

For $l=1, 2 \ldots j$ $SP_{1st,j}^{en}=SP_{1st,j}^{en}+(p_l^{ex}+t_l^{ex})-(p_l^{en}+t_l^{en})$ next l $SP_{1st,j}^{en}=SP_{1st,j}^{en}-(p_j^{en}+t_j^{en})$ next j $SP_{1st,*}^{en}=\max(SP_{1st,1}^{en}, SP_{1st,2}^{en}, SP_{1st,3}^{en}, \ldots SP_{1st,j}^{en}, j=1,2, \ldots m^{en},)$ Step 3: Track the movement of wafers in transition. The movement of wafers in transition can be tracked. The arrival time $T_{ijk}^{in}$ of the ith wafer at the jth module transported by the kth robot is the departure time $T_{i(j-1)k}^{out}$ from the prior j−1th process module plus the transport time $t_j$ from the (j−1)th to the jth module:

$$T_{ijk}^{in}=T_{i(j-1)k}^{out}+t_j \quad (C)$$

In turn, the departure time from the jth module is the arrival time plus the processing time and queues deliberately inserted for conflict resolution:

$$T_{ijk}^{out}=T_{ijk}^{in}+p_j+q_{ij} \quad (D)$$

The recursive formulae of Equations (C) and (D) above permit one to map out the movement of the wafers in transition. Thus, measuring time from when the last wafer of the exiting lot is launched and transition begun, see FIG. 11, the arrival and departure of a wafer at a process module can be calculated per the algorithm below. The arrival and departure times outside of the transition are not considered and therefore marked with large negative values. For wafers of the exiting lot, see FIG. 11:

For $i=1, 2 \ldots n^{ex}$ $T_{i1k}^{in}=-\infty$

Sum=0

For $j=1, 2 \ldots m^{ex}$ $\text{Sum}=\text{Sum}+p_j^{ex}+q_{ij}^{ex} \quad (E)$ $T_{ijk}^{out}=\text{Sum}-(n^{ex}-i)*SP_*^{ex}$ if $j=m^{ex}$, go to out $T_{i(j-1)k}^{in}=T_{ijk}^{out}+t_j^{ex}$ if $(T_{i(j+1)k}^{in} \leq 0, -\infty, T_{i(j+1)k}^{in})$ if $(T_{ijk}^{out} \leq 0, -\infty, T_{ijk}^{out}) \quad (E)$ out:
next j
next i
For wafers of the entering lot, Sum=0

For $i=(n^{ex}+1),(n^{ex}+2), \ldots (n^{ex}-1+n^{en}), (n^{ex}+n^{en})$ $\text{Sum}=\text{Sum}+SP_{i-n^{ex}}^{en}$ (Note: $SP_i^{en}$=delay)

Psum=Sum $\quad (F)$

For $j=1, 2 \ldots m^{en}$ $P\text{sum}=P\text{sum}+p_j^{en}+q_{ij}^{en}+t_j^{en} \quad (G)$ $T_{ijk}^{out}=P\text{sum}-t_j^{en}$ if $j=m^{en}$, go to out1

$T_{i(j+1)k}^{in}=T_{ijk}^{out}+t_j^{en}$

Out1:
    next j
    next i

Step 4: Identify conflicts. Having determined the arrival time $T_{ijk}^{in}$ and the departure time $T_{ijk}^{out}$, one can check for conflicts. A process conflict occurs when a process module at the jth process step is called on to process sequentially a pair of wafer, the nth and the nth, within a time interval shorter than the process time. In other words, the nth wafer arrives before the mth wafer departs from the module. Thus conflict occurs if the following is true:

$$OR\{AND[(T_{mjk}^{out} \geq T_{njk}^{out}),(T_{njk}^{out} \geq T_{mjk}^{in})], AND [(T_{mjk}^{out} \leq T_{njk}^{out}),(T_{mjk}^{out} \geq T_{njk}^{in})]\}$$

By using above logic statement to examine all possible combination of (m,n) pairs for all process steps, all process conflicts may be identified:

For j=1 to $(m^{ex}+m^{en})$
For m=1 to $(n^{ex}+n^{en})$
For n=1 to m−1
Conflict if $$OR\{AND\ [(T_{mjk}^{out} \geq T_{njk}^{out}),(T_{njk}^{out} \geq T_{mjk}^{in})], AND [(T_{mjk}^{out} \leq T_{njk}^{out}),(T_{mjk}^{out} \geq T_{njk}^{in})]\}=TRUE$$

next m
next n

Similarly, a transport conflict occurs when a robot, the kth robot, is called on to transport sequentially two wafers, the mth and the nth, within a time interval shorter than the transport time. In other words, the time interval between the arrival of the mth wafer and the departure of the nth wafer is shorter than the transport time. Thus transport conflict occurs if the following is true:

$$OR[|T_{mjk}^{out}-T_{njk}^{out}|<g, |T_{mjk}^{out}-T_{njk}^{in}|<g, |T_{mjk}^{in}-T_{njk}^{out}|<g, |T_{mjk}^{in}-T_{njk}^{in}|<g]$$

In the above, the symbol |•| denotes absolute value and "g" is the time allocated for the robot to make one transport move. The time "g" is greater or equal to the transport time of the robot. By using above logic statement to examine all possible combination of (m,n) pairs for all process steps, all transport conflicts may be determined:

For j=1 to $(m^{ex}+m^{en})$
For m=1 to $(n^{ex}+n^{en})$
For n=1 to m−1
Conflict if $$OR[|T_{mjk}^{out}-T_{njk}^{out}|<g, |T_{mjk}^{out}-T_{njk}^{in}|<g, |T_{mjk}^{in}-T_{njk}^{out}|<g, |T_{mjk}^{in}-T_{njk}^{in}|<g]=TRUE$$

next m
next n

Step 5: Resolve conflict through proper queuing and launching. Note that in Equations (E) through (G), there are three yet undetermined variables used in the calculation of arrival and departure time of a wafer at a process module by a particular robot. These are the intentional delays called queues $q_{ij}^{ex}$, $q_{ij}^{en}$ and the timing of launching the wafer of the entering lot $SP_i^{en}$. Optimization procedures are used to find the best combination of these three variables such that there is no conflict and the total queues is minimized. Genetic Algorithms are one such optimization procedure. Others will be apparent to one skilled in the art.

The foregoing description of various embodiments of the invention has been presented for purposes of illustration and description. It is not intended to limit the invention to the precise forms disclosed. Many modifications and equivalent arrangements will be apparent.

Architecture of the Cluster Tool Including Local Clocks

Figure 13:
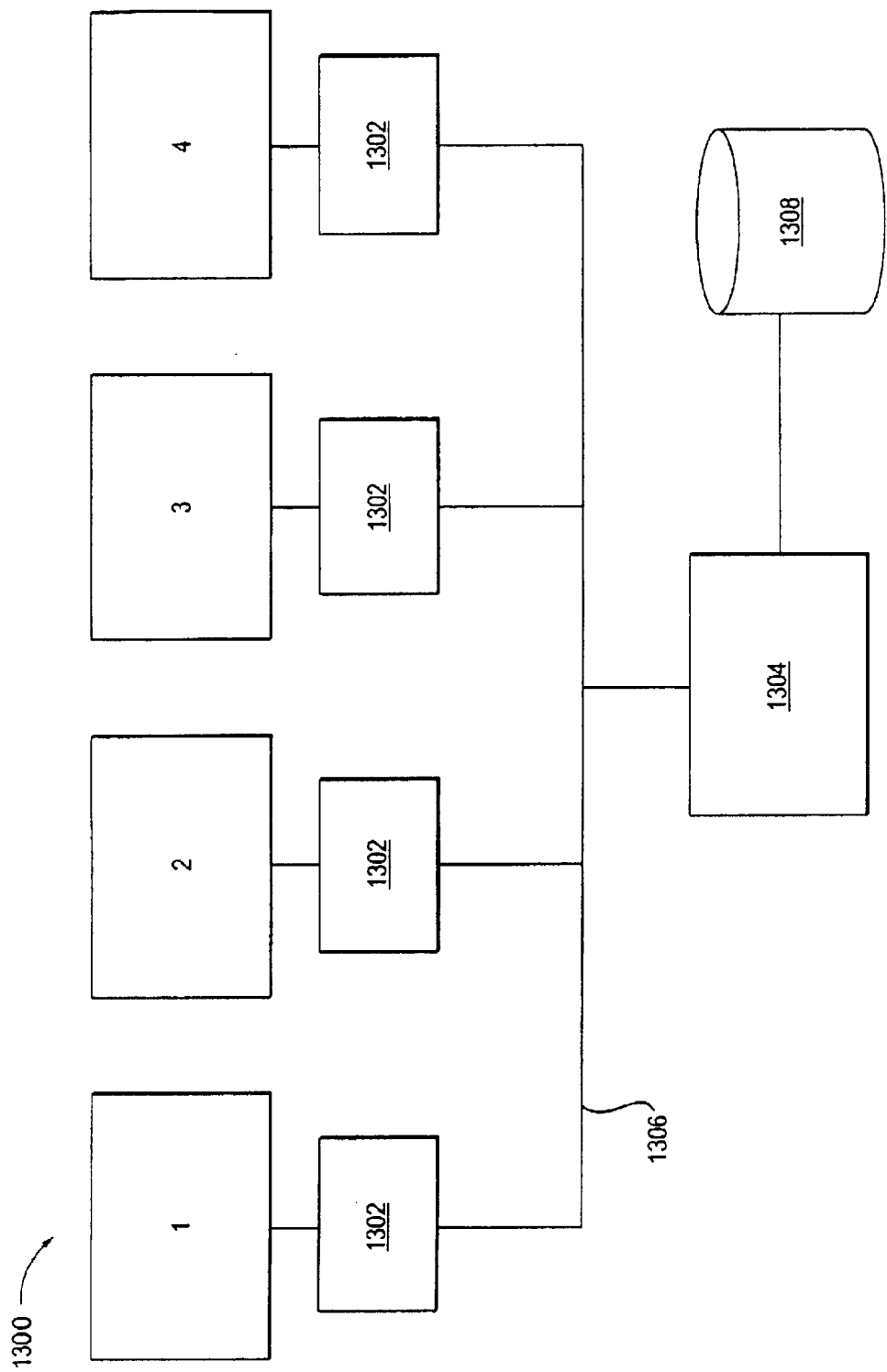
FIG. 13 illustrates a plurality of local clocks in an embodiment of the invention.

An embodiment of a wafer cluster tool used in the invention is illustrated schematically in FIG. 13. The cluster tool includes a series of process modules 1300 arranged in linear order. Wafer clusters are processed by sending them through the series of process modules 1300, according to algorithms described earlier in this specification.

In the embodiment illustrated in FIG. 13, each of the process modules includes a local clock 1302. The local clock may reside on a processor coupled to the process module 1300. The local clocks 1302 are coupled to a server including a master clock 1304 via a Local Area Network, or LAN 1306. In an embodiment of the invention, the master clock 1304 periodically pings the local clocks 1302 in order to synchronize the local clocks 1302 with the master clock 1304.

The master clock is in communication with a timetable 1308. The timetable 1308 comprises a database which stores the times recorded on the plurality of local clocks 1302. The timetable 1308 may reside on the server including the master clock 1304, or on a separate server coupled to the master clock 1304. The timetable 1308 may be stored in the form of a spreadsheet, a relational database, a flat file, or a customized data structure, as will be apparent to one skilled in the art. In embodiments of the invention, the times noted by the local clocks 1302 or the master clock 1304 are recorded in units of the sending period.

In some embodiments of the invention, each time a wafer cluster enters a process module 1300, the module's local, or internal clock is reset and registered in the timetable 1308. The timetable 1308 is continuously updated in real-time, so that it may retain a current record of local clocks 1302 in the cluster tool. As the total time a wafer resides in a given module 1300 is predetermined by the scheduling algorithm, the timetable 1308 will identify wafer pickup times for each module 1300.

Robot Pre-positioning in the Cluster Tool

Embodiments of the invention allow a robot to be positioned at an upcoming module immediately after completion of a prior task. In such embodiments, the robot will pre-position itself in front of the module to be served immediately upon completion of the prior task. By pre-positioning robots at modules, excessive wait time beyond the queueing time is eliminated, thereby improving the throughput of the cluster tool. This allows robot path to be pre-determined along with the processing schedule, and minimizes any need for including multiple grippers on robots for throughput improvements.

Figure 14:
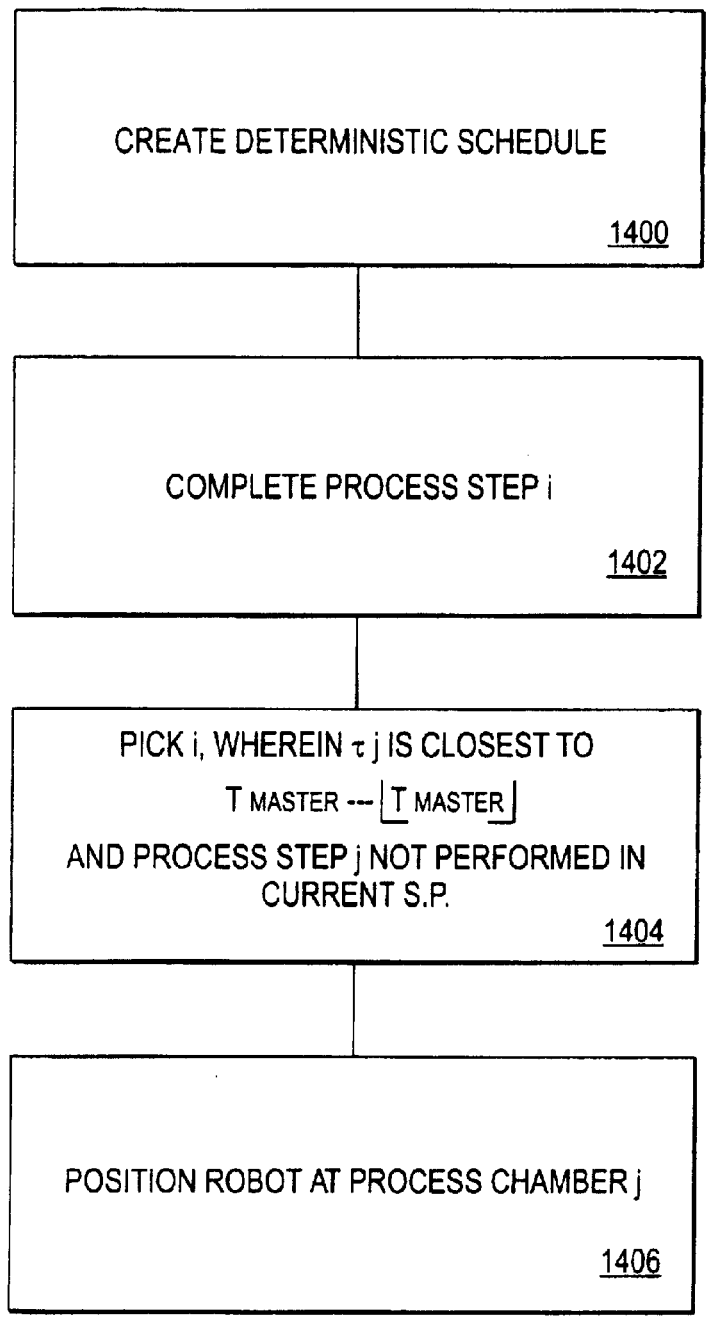
FIG. 14 illustrates a robot positioning algorithm used in an embodiment of the invention.

An embodiment of the invention supporting pre-positioning is illustrated in FIG. 14. The process starts with the generation of a deterministic schedule 1400 for the cluster tool. This involves inserting queues in the module processing times in order to eliminate robot conflicts, and may be performed by the linear transformations or genetic algorithms described earlier. The deterministic schedule exhibits periodicity, with an interval of one sending period. Upon completion of a process step i by a robot R 1402, the cluster tool refers to the timetable 1308, to determine which process step robot R is to position itself by. This step 1404 involves picking a process step j, wherein $\tau_j$ is closest to the decimal portion of the current time on the master clock $T_{master}$, and process step j has not been performed in the current sending period. To reiterate, the step 1404 involves:

pick a j from the timetable 1308, wherein $\tau_j$ is closest to $T_{master}-\text{INT}(T_{master})$
and step j has not been performed in current sending period When such a process step j is found in the timetable 1308, the robot R is positioned at process chamber j.

Benefits of Robot Pre-Positioning

It will be apparent to one skilled in the art that by combining the pre-deterministic processing schedule 1400 with the robot pre-positioning algorithm described above, the path of the individual robots in the cluster tool becomes pre-deterministic. Because the timetable 1308 is updated in real-time, and the schedule 1400 is identical in each sending period, the collection of τhd jvalues maintained in the timetable 1308 is identical in each sending period. As such, the selection of $\tau_j$ for each robot R will also repeat at intervals of one sending period. Thus path of robot R will exhibit periodicity along with the cluster tool schedule. This enables the path of each robot R to be pre-determined along with the generation of the cluster-tool schedule 1400.

The pre-positioning algorithm described above improves the throughput of the cluster tool. In particular, each module that needs to be serviced will already have a requisite robot positioned in front of it. This eliminates any wait-time required for the robot, thereby eliminating any latency beyond the queuing used to eliminate conflicts. Optimization of the queue times, according to the algebraic techniques or the genetic algorithm described earlier, along with elimination of robot redundancy by use of pre-positioning, maximizes the throughput of the cluster tool.

Robot pre-positioning also allows the system to use single gripper robots. To elaborate, multiple gripper robots are typically used in the prior art in order to allow wafer swapping and minimize the number of robot transfers. This adds an additional constraint to the cluster tool, as a robot with dual grippers requires a wafer on one of the grippers in order to perform the swapping. This constrains the performance of the cluster tool. Furthermore, the swapping increases transport time between modules, which may ultimately slow the throughput of the cluster tool.

By eliminating robot wait times, the improvement in throughput enabled by robot pre-positioning minimizes any need to perform wafer swapping. Thus, the cluster tool may employ robots with a single gripper. This simplifies the robot, and minimizes any need for on-board processing in the robots.

What is claimed is:

1. A method for synchronizing a wafer cluster tool, the wafer cluster tool including a plurality of process modules, the method comprising:
   a) generating a deterministic schedule for the wafer cluster tool, the deterministic schedule having a periodicity of a sending period;
   b) loading a first wafer set into a first process module in the cluster tool according to the schedule;
   c) in response to loading the first wafer set in the first process module, resetting a first local clock coupled to the first process module;
   d) recording a first time from the first local clock in a timetable, the timetable coupled to the plurality of process modules, the first time measured in units of the sending period;
   e) loading a second wafer set into a second process module in the cluster tool according to the schedule;
   f) in response to loading the second wafer set in the second process module, resetting a second local clock coupled to the second process module;
   g) recording a second time from the second local clock in the timetable in units of the sending period.

2. The method of claim 1, further comprising:
   h) one sending period after the loading the first wafer set, loading a third wafer set into the first process module according to the schedule.

3. The method of claim 2, further comprising:
   i) in response to loading the third wafer set, resetting the first local clock coupled to the first process module.

4. The method of claim 3, further comprising:
   j) recording a third time from the first local clock in the timetable, the third time measured in units of the sending period.

5. A method for positioning a robot in a wafer cluster tool, the wafer cluster tool including a first process module, a second process module, and a third process module, the method comprising:
   generating a deterministic schedule for the wafer cluster tool, the schedule having a periodicity defined by a sending period, wherein the schedule has a first pickup time for the first module in the cluster tool, and a second pickup time for the third module, the second pickup time occurring after the first pickup time, the deterministic schedule including a first instant and a second instant, wherein the first and second instants are separated by a time span equal to the sending period;
   loading a first wafer in the cluster tool at the first instant;
   picking up a second wafer from the first module with a robot, the picking up the second wafer occurring between the first and second instants;
   delivering the second wafer from the first module to the second module with the robot before the second instant;
   immediately after the delivering the second wafer, positioning the robot at the third module, the positioning the robot at the third model occurring before the second pickup time; and
   delivering the second wafer from the third module to a fourth module by use of the robot before the second instant; wherein the first module is coupled to a first local clock, the second module is coupled to a second local clock, the third module is coupled to a third local clock, and the fourth module is coupled to a fourth local clock.

6. A method of positioning robots in a wafer cluster tool, the wafer cluster comprising a plurality of process modules, the wafer cluster including a first robot and a second robot, wherein the wafer cluster tool operates according to a periodic schedule, the periodic schedule being defined by a sending period, the method comprising:
   a) transferring a first wafer from a first process module in the plurality of process modules to a second process module in the plurality of modules by use of the first robot;
   b) immediately after step a, positioning the first robot at a third process module
   c) transferring a second wafer from a third process module in the plurality of process modules to a fourth process module in the plurality of modules by use of the second robot;
   d) immediately after step c, positioning the second robot at a fifth process module;
   wherein steps a through d are conducted within a first time interval, the first time interval having a duration equal to the sending period.

7. The method of claim 6, wherein the first robot and the second robot each have only one gripper.

* * * * *